(12) United States Patent  
Hook (10) Patent No.: US 9,142,564 B2  
(45) Date of Patent: Sep. 22, 2015

(54) PSEUDO BUTTED JUNCTION STRUCTURE FOR BACK PLANE CONNECTION

(71) Applicant: International Business Machines Corporation, Armonk, NY (US)

(72) Inventor: Terence B. Hook, Jericho, VT (US)

(73) Assignee: GLOBALFOUNDRIES U.S. 2 LLC COMPANY, Hopewell Junction, NY (US)

( * ) Notice: Subject to any disclaimer, the term of this patent is extended or adjusted under 35 U.S.C. 154(b) by 48 days.

(21) Appl. No.: 13/914,897

(22) Filed: Jun. 11, 2013

(65) Prior Publication Data

US 2013/0270642 A1 Oct. 17, 2013

Related U.S. Application Data

(62) Division of application No. 12/964,082, filed on Dec. 9, 2010, now Pat. No. 8,513,106.

(51) Int. Cl.

| H01L 27/12 | (2006.01) |
|---|---|
| H01L 21/84 | (2006.01) |
| H01L 29/786 | (2006.01) |

(52) U.S. Cl.
CPC ............ *H01L 27/1203* (2013.01); *H01L 21/84* (2013.01); *H01L 29/78648* (2013.01)

(58) Field of Classification Search
CPC ................ H01L 21/84; H01L 27/1203; H01L 29/78648
USPC ........................................................ 257/351
See application file for complete search history.

(56) References Cited

U.S. PATENT DOCUMENTS

| 5,942,781 | A | 8/1999 | Burr et al. |
|---|---|---|---|
| 6,100,567 | A * | 8/2000 | Burr ............................... 257/365 |
| 6,380,010 | B2 | 4/2002 | Brigham et al. |
| 6,965,151 | B2 | 11/2005 | Burr |
| 7,491,586 | B2 | 2/2009 | Horch et al. |
| 7,709,313 | B2 | 5/2010 | Bryant et al. |
| 7,772,647 | B2 | 8/2010 | Anderson et al. |
| 7,772,649 | B2 | 8/2010 | Cheng et al. |
| 2005/0233506 | A1 | 10/2005 | Horch et al. |
| 2007/0029620 | A1 | 2/2007 | Nowak |
| 2008/0061400 | A1* | 3/2008 | Williams et al. ............... 257/546 |
| 2008/0258221 | A1 | 10/2008 | Dennard et al. |
| 2009/0030254 | A1 | 1/2009 | Spicer |
| 2009/0302366 | A1* | 12/2009 | Anderson et al. ............. 257/301 |
| 2010/0176453 | A1 | 7/2010 | Dennard et al. |

OTHER PUBLICATIONS

Nga Doan, Notice of Allowance issued in U.S. Appl. No. 12/964,082 dated Apr. 10, 2013.

* cited by examiner

*Primary Examiner* — Thao X Le
*Assistant Examiner* — Nga Doan
(74) *Attorney, Agent, or Firm* — Thompson Hine LLP; Anthony J. Canale (57) ABSTRACT

Butted p-n junctions interconnecting back gates in an SOI process, methods for making butted p-n junctions, and design structures. The butted junction includes an overlapping region formed in the bulk substrate by overlapping the mask windows of the ion-implantation masks used to form the back gates. A damaged region may be selectively formed to introduce mid-gap energy levels in the semiconductor material of the overlapping region employing one of the implantation masks used to form the back gates. The damage region causes the butted junction to be leaky and conductively couples the overlapped back gates to each other and to the substrate. Other back gates may be formed that are floating and not coupled to the substrate.

8 Claims, 4 Drawing Sheets

PSEUDO BUTTED JUNCTION STRUCTURE FOR BACK PLANE CONNECTION

CROSS-REFERENCE TO RELATED APPLICATIONS

This application is a divisional of application Ser. No. 12/964,082, filed Dec. 9, 2010 (pending), which is hereby incorporated by reference herein in its entirety.

BACKGROUND

The present invention relates generally to semiconductor device fabrication and, more particularly, to back gates for SOI devices, methods of forming back gates, and design structures for integrated circuits including the SOI devices.

Semiconductor devices must constantly offer higher performance in a smaller size to satisfy the demand for increased computing power and functionality from integrated circuits. As feature sizes shrink with advances in technology, the dimensions of the spaces between devices are correspondingly reduced. One of the barriers to further improvements in chip densities encountered with standard Complementary Metal-Oxide-Semiconductor (CMOS) technology is maintaining device isolation with increasing device density. Devices sharing the same bulk semiconductor typically rely on p-n junctions for isolation and, as dimensions shrink, leakage currents and latch-up resulting from unwanted interactions between devices can limit the integration densities achievable.

Devices fabricated using semiconductor-on-insulator (SOI) technologies provide certain performance improvements, such as lower parasitic junction capacitance, increased latchup resistance, and reduced power consumption at equivalent performance, in comparison with comparable devices built directly in a bulk silicon substrate. Generally, an SOI wafer includes a thin SOI layer of semiconductor material (e.g., silicon), a bulk substrate (e.g., a bulk silicon substrate or a silicon epilayer on a bulk silicon substrate), and a thin buried insulator layer, such as a buried oxide or BOX layer, physically separating and electrically isolating the SOI layer from the bulk substrate. In one manifestation of SOI technology, the transistor is devised such that if the BOX layer is thin enough that the electrical potential of the silicon bulk can conveniently influence the transistor.

Therefore, there is a need for improved device structures that can be fabricated that provide increased integration densities and improved device performance, as well as methods of making these device structures and design structures for an integrated circuit.

BRIEF SUMMARY

In an embodiment, a method is provided for forming a device structure on a semiconductor-on-insulator (SOI) substrate having a semiconductor layer, a bulk substrate of a first conductivity type, and buried dielectric layer between the semiconductor layer and the bulk substrate. The method includes forming a first back gate of the first conductivity type in the bulk substrate. The method further includes forming a second back gate of a second conductivity type in the bulk substrate and laterally adjacent to the first back gate so that a portion of the first back gate spatially coincides with a portion of the second back gate to define an overlapping region electrically coupling the second back gate with the bulk substrate.

In another embodiment, a device structure is formed on a semiconductor-on-insulator (SOI) substrate having a semiconductor layer, a bulk substrate of a first conductivity type, and buried dielectric layer between the semiconductor layer and the bulk substrate. The device structure includes a first back gate of the first conductivity type and a second back gate of a second conductivity type in the bulk substrate. The first back gate is electrically coupled with the bulk substrate of the first conductivity type, which may be p-type. The second back gate is laterally adjacent to the first back gate. An overlapping region is defined by spatial coincidence of a portion of the first back gate and a portion of the second back gate. The overlapping region is configured to electrically couple the second back gate with the first back gate so that the second back gate is electrically coupled with the bulk substrate.

In another embodiment, a design structure is provided that is embodied in a machine readable medium for designing, manufacturing, or testing an integrated circuit. The design structure includes a semiconductor-on-insulator (SOI) substrate having a semiconductor layer, a bulk substrate of a first conductivity type, and buried dielectric layer between the semiconductor layer and the bulk substrate. The design structure further includes a first back gate of the first conductivity type and a second back gate of a second conductivity type in the bulk substrate. The first back gate is electrically coupled with the bulk substrate of the first conductivity type. The second back gate is laterally adjacent to the first back gate. The design structure further includes an overlapping region defined by spatial coincidence of a portion of the first back gate and a portion of the second back gate. The overlapping region is configured to electrically couple the second back gate with the first back gate so that the second back gate is electrically coupled with the bulk substrate. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Embodiments of the present invention generally provide back gates for field effect transistors formed using a semiconductor-on-insulator (SOI) wafer or an extremely thin silicon on insulator (ETSOI) wafer. Oppositely-doped regions defining back gates may share a region of overlapping doping and a damage region may be formed in the overlapping region by, for example, ion implantation to define a leaky junction between the back gates. The leaky junction provides an electrical connection between the substrate and the back gate having opposite conductivity type to the substrate. As a result, the back gate of opposite conductivity type is not electrically floating relative to the substrate and any floating body effect is mitigated or eliminated.

Figure 1:
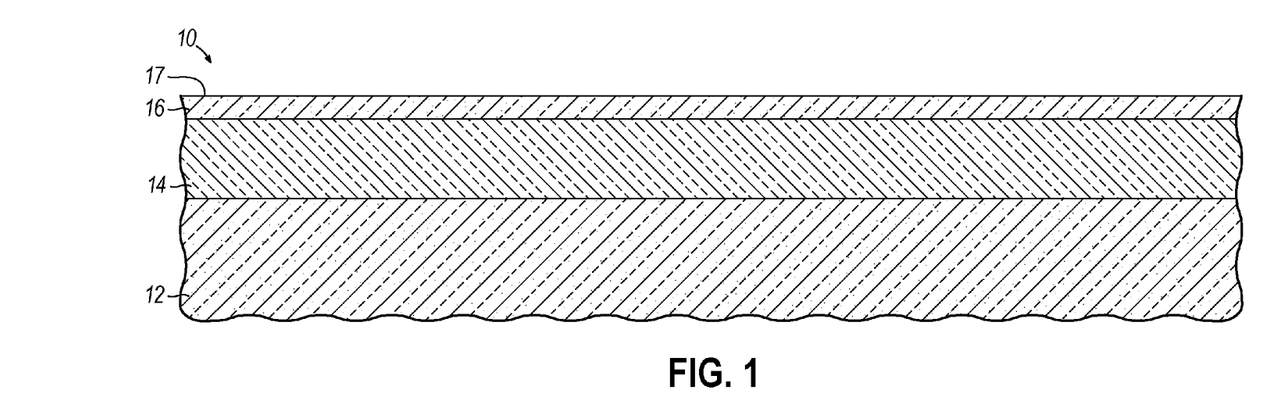
FIG. 1 is a diagrammatic cross-sectional view of a portion of a substrate taken at an initial fabrication stage of a processing method in accordance with an embodiment of the invention.

With reference to FIG. 1 and in accordance with an embodiment of the invention, an SOI wafer 10 includes a bulk substrate 12, which may be formed of p⁻ silicon, a buried dielectric layer 14, and an SOI layer 16 physically and electrically separated from the substrate 12 by the buried dielectric layer 14. The SOI layer 16 may be composed of silicon or another semiconductor material recognized as suitable for device fabrication by a person having ordinary skill in the art. In a representative ETSOI construction, the SOI layer 16 may be crystalline silicon having a representative thickness of 20 nm or less and the buried dielectric layer 14 may have a representative thickness of 50 nm or less.

Figure 2:
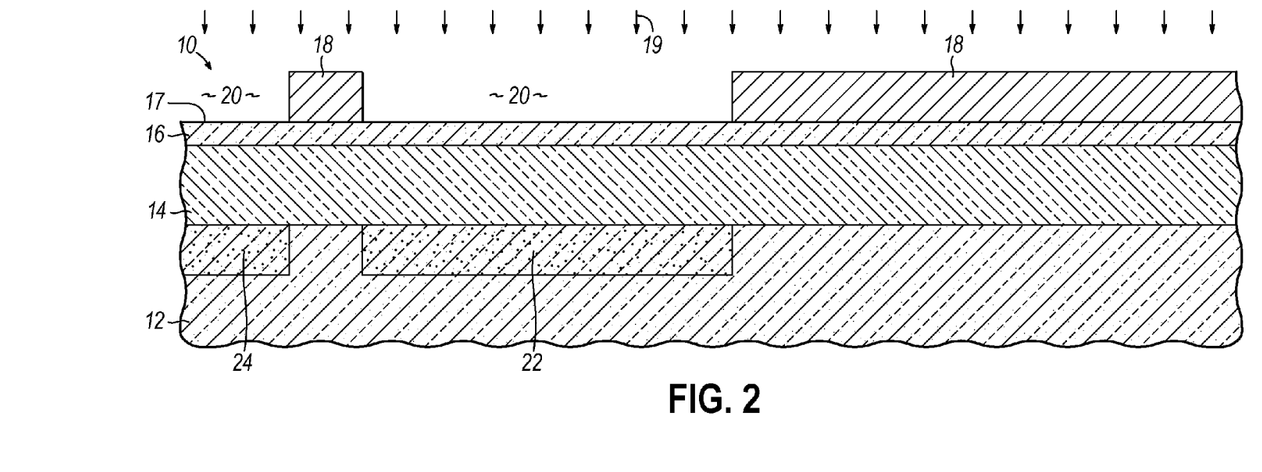
FIGS. 2-5 are diagrammatic cross-sectional views of the substrate portion of FIG. 1 at a series of subsequent fabrication stages.

With reference to FIG. 2 in which like reference numerals refer to like features in FIG. 1 and at a subsequent fabrication stage, doped regions 22, 24 containing semiconductor material of a first conductivity type are formed in the substrate 12 below the buried dielectric layer 14. A masking layer 18 is applied to a top surface 17 of the SOI layer 16 and windows or openings 20 are formed in the masking layer 18. The openings 20 are aligned with the intended locations of the doped regions 22, 24 in the substrate 12. Energetic ions, as indicated by the single-headed arrows 19, are introduced using ion implantation at a selected kinetic energy and dose. The energetic ions 19 penetrate through the buried dielectric layer 14 and the SOI layer 16 to reach the substrate 12. The masking layer 18 operates as an ion-implantation mask that protects the covered surfaces of the SOI layer 16 and substrate 12 from receiving an implanted dose of the ions 19. The areas of the openings 20 define the respective areas of the doped regions 22, 24 in a plane parallel to the top surface 17 if lateral straggle of ions 19 is neglected from the area determination.

The first conductivity type of the doped regions 22, 24 is opposite to the conductivity type of the substrate 12. In a representative embodiment, the doped regions 22, 24 may be implanted with a species that is an n-type dopant, such as phosphorous (P), arsenic (As), or antimony (Sb). The implant conditions, such as dose and kinetic energy, are selected to provide a projected range and a dopant concentration that defines the doped regions 22, 24 in the substrate 12. Representative dopant concentrations for the doped regions 22, 24 may be $1\times10^{18}$ atoms per cm³ or higher. Multiple implantations may be used to form the doped regions 22, 24.

The masking layer 18 may be formed of a resist layer that is applied to the top surface 17 and photolithographically patterned in a conventional manner, and for which the thickness is selected to provide the needed stopping of ions 19 outside of the openings 20. The masking layer 18 may be removed from the top surface 17 by ashing or solvent stripping and a conventional cleaning process is applied.

Figure 3:
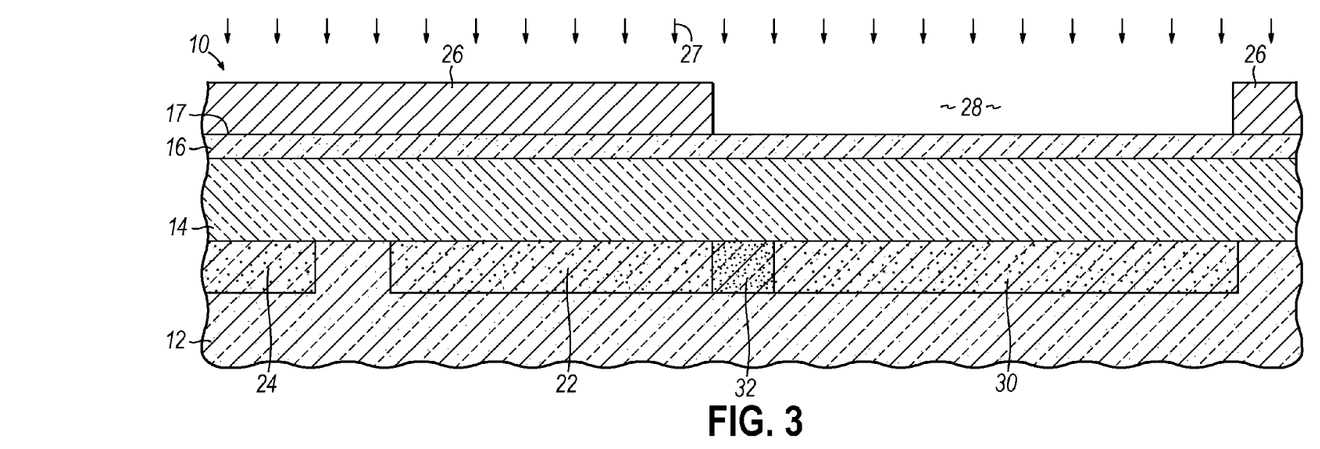

With reference to FIG. 3 in which like reference numerals refer to like features in FIG. 2 and at a subsequent fabrication stage, a doped region 30 is formed in the substrate 12 below the buried dielectric layer 14 laterally adjacent to the doped region 22 of opposite conductivity type. The doped region 30 participates in forming an overlapping region 32 that is shared with the doped region 22. The overlapping region 32 represents a section or portion of the doped region 22 that spatially coincides with a section or portion of doped region 30 to share a volume of semiconductor material within the substrate 12. The overlapping region 32 has a conductivity type determined by a net dopant concentration of the dopants of opposite conductivity type in regions 22, 30. The overlapping region 32, which is located between the non-overlapping portions of the doped regions 22, 30, may form a butted junction between the doped regions 22, 30 if the doping levels are high enough to create a tunnel diode in this regions, typically $1\times10^{19}$ atoms per cm³ or higher. The overlapped portions of doped regions 22, 30 represent a minor fraction of the respective total doped volumes of the semiconductor material of substrate 12.

A masking layer 26 is applied to the top surface 17 of the SOI layer 16 and a window or opening 28 containing semiconductor material of a second conductivity type is formed in the masking layer 26. The window 28 is aligned with the intended location of the doped region 30 in the substrate 12. Energetic ions, as indicated by the single-headed arrows 27, are introduced using ion implantation at a selected kinetic energy and dose. The energetic ions 27 penetrate through the buried dielectric layer 14 and the SOI layer 16 to reach the substrate 12. The masking layer 26 operates as an ion-implantation mask that protects the covered surfaces of the SOI layer 16 and substrate 12 from receiving an implanted dose of the ions 27. The area of the opening 28 defines the area of the doped region 30 in a plane parallel to the top surface 17, if lateral straggle of ions 27 is neglected, as well as the extent of the overlap with doped region 22 to produce the overlapping region 32 containing implanted impurity species of the opposite dopant types.

The conductivity type of the doped region 30 is opposite to the conductivity type of the doped regions 22, 24 and the same conductivity type as the substrate 12. In this representative embodiment, the doped region 30 may be implanted with a species that is a p-type dopant, such as boron (B), aluminum (Al), gallium (Ga), or indium (In). The implant conditions, dose and kinetic energy, are selected to provide a projected range and a dopant concentration that defines the doped region 30 and the overlapping region 32 in the substrate 12. Representative dopant concentrations for the doped region 30 may be $1\times10^{18}$ atoms per cm³ or higher.

The masking layer 26 may be formed of a resist layer that is applied and photolithographically patterned in a conventional manner, and for which the thickness is selected to provide the needed ion stopping outside of the opening 28 to the top surface 17. The masking layer 26 may be removed from the top surface 17 by ashing or solvent stripping and a conventional cleaning process is applied.

One or more anneals may be used to electrically activate and diffuse the implanted impurities in the doped regions 22, 24, doped region 30, and the overlapping region 32, as well as to repair the primary implantation damage to the crystalline lattice from the implantations.

Figure 4:
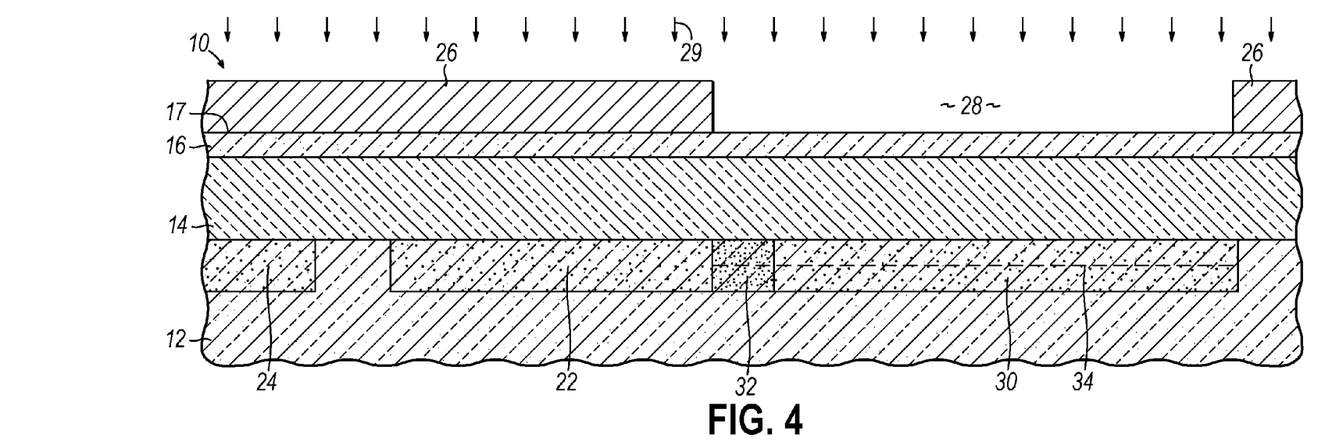

With reference to FIG. 4 in which like reference numerals refer to like features in FIG. 3 and at a subsequent fabrication stage, a damage region 34 is formed in the doped region 30 and in the overlapping region 32. The damage region 34 may be formed using the same masking layer 26 previously used to form the doped region 30 and the overlapping region 32. This commonality of the window 28 in the ion-implantation mask localizes the damage region 34 in a plane parallel to the top surface 17 and results in self-alignment of the damage region 34 with the doped region 30 and the overlapping region 32. The addition of the damage region 34 to the overlapping region 32 modifies the structure of the overlapping region 32 to electrically couple, via an ohmic contact and a leakage current, the doped region 22 of opposite conductivity type to the bulk substrate 12 with the doped region 30 and thereby with the bulk substrate 12 even if the doping level is not high enough to form a tunnel junction.

The damage region 34 may contain crystalline defects formed by implanting energetic ions, as indicated diagrammatically by singled-headed arrows 29, with selected implant conditions into the substrate 12. The area of the opening 28 defines the area of the damage region 34 in a plane parallel to the top surface 17. The masking layer 26 may protect the covered surfaces of the SOI layer 16 and substrate 12 from receiving an implanted dose of the ions 29. In particular, the doped region 24 and the portion of doped region 22 that does not contribute to the overlapping region 32 are masked by the masking layer 26 against being implanted with the ions 29. The crystalline defects introduce midgap energy levels in the bandgap of the semiconductor material forming the bulk substrate 12.

In one embodiment, ions 29 may be generated from silicon (Si), germanium (Ge), nitrogen (N), oxygen (O), carbon (C), an inert gas such as argon (Ar) or xenon (Xe), or some combination thereof. The kinetic energy of the ions 29 is selected to provide a projected range and a range straggle within the substrate 12 that confines the damage region 34 to a band that is contained in depth relative to the top surface 17 within the shallow and deep boundaries of the regions 30, 32. The implanted dose of ions 29 is selected to promote the formation of defects in the damage region 34 and, as a result, causes crystalline damage in both the overlapping region 32 and doped region 30.

The energetic ions 29, as they penetrate into the SOI wafer 10, lose energy via scattering events with atoms and electrons in the lattice structure of the constituent semiconductor material. Electronic energy losses dominate at relatively high energies and shallow depths in the SOI layer 16, and nuclear energy losses dominate at relatively low energies and near the projected range in the substrate 12. Energy lost by the ions 29 in electronic interactions is subsequently transferred to phonons, which produces heating but little or no permanent crystalline damage to the SOI layer 16. Energy lost in nuclear collisions displaces target atoms of the substrate 12 from their original lattice sites, which damages the lattice structure of the substrate 12 and causes point defects. The point defects may accumulate in larger aggregates to form dislocations or even voids. For example, a thermal anneal applied to the structure may induce uncombined points defect and inert gas atoms to agglomerate and form voids.

The damage region 34 contains point defects and inert gas atoms from the stopped ions 29 and extends horizontally in a plane substantially parallel to the top surface 17. The point defects and inert gas atoms from the stopped ions 29 have similar depth profiles each distributed with a range straggle about a projected range, which is measured as a perpendicular distance of the maximum ion concentration and a maximum point defect peak from the top surface 17. Essentially all of the implanted ions 29 stop within a distance of roughly three times the range straggle from the projected range, which implies that the depth profile for the point defects is spatially similar to the depth profile for the inert gas atoms.

The masking layer 26 may be removed by ashing or solvent stripping and a conventional cleaning process is applied.

In an alternative embodiment, the doped regions 22, 24 may be formed after formation of the doped region 30 and damage region 34. In another alternative embodiment, the doped regions 24 may be formed simultaneously with the doped region 30 by adjusting the ion implantation mask for region 30 and damage region 34 may be formed using the same implantation mask as used to form doped region 22. In this manner, the overlapping region 32 still contains the damage region 34, but the doped region 22 has the same conductivity type as the doped region 30.

Figure 5:
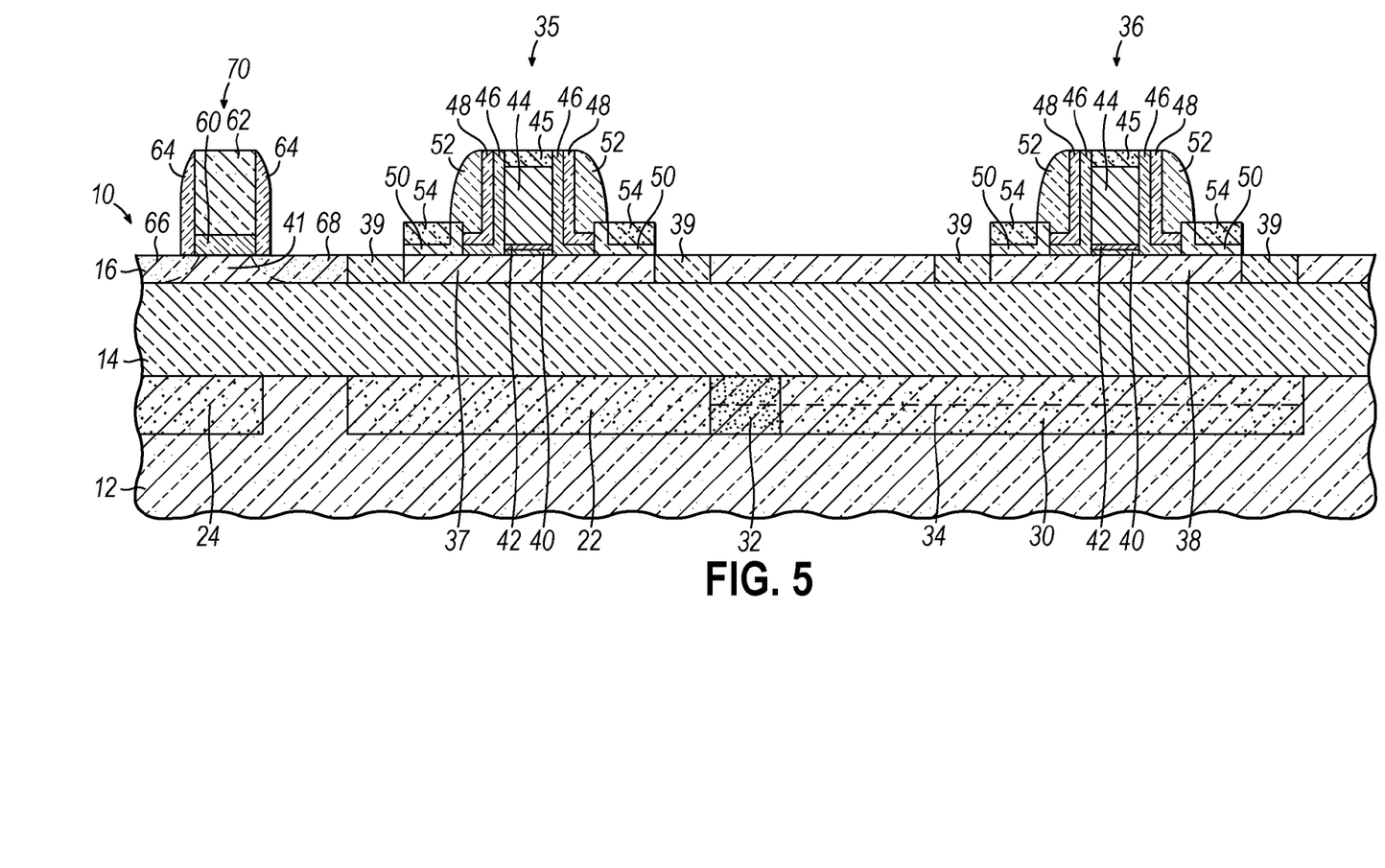

With reference to FIG. 5 in which like reference numerals refer to like features in FIG. 4 and at a subsequent fabrication stage, field effect transistor (FET) devices 35, 36, 70 are formed using the SOI wafer 10. Active regions 37, 38, 41 of the SOI layer 16 may be defined by isolation regions 39 formed using, for example, a shallow trench isolation (STI) process. The STI process may include formation of a patterned hardmask on the SOI layer 16 and reactive ion etching (RIE) to form trenches by etching through the SOI layer 16 down to the buried dielectric layer 14. The trenches may be filled by deposition of an STI oxide, such as silicon dioxide ($SiO_2$), followed by planarization using a chemical mechanical polishing (CMP) process to form isolation regions 39. The hardmask may then be removed from the SOI layer 16 using a wet or dry etching process.

Dopants may be introduced into active regions 37, 38, 41 to provide channel doping for the devices 35, 36, 70. The channels of each individual device may be selectively doped with either an n-type or p-type doping, or left un-doped, depending on the type of device 35, 36, 70. The channel doping process may include forming of a sacrificial oxide layer on the SOI layer 16. The sacrificial oxide layer may then be patterned using photolithographic and etching methods so that windows are formed in the sacrificial oxide over the active region 37, 38 to be doped, followed by ion implantation and activation steps. Alternatively, the formation of the sacrificial oxide layer may be omitted, and a patterned resist layer used as an ion-implantation mask. The active regions 37, 38, 41 may be composed of n-type semiconductor material formed by implanting a dopant such as P, As, Sb, or other suitable n-type dopant or p-type semiconductor material formed by implanting a dopant such as B, Al, Ga, In, or any other suitable p-type dopant. After ion implantation is complete, the sacrificial oxide layer is removed. Alternatively, if all devices 35, 36, 70 are destined to have undoped channels, active region doping may be omitted.

The FET devices 35, 36 may be formed before device 70. To that end, gate stacks including a gate insulator layer 40, a metal gate layer 42, and a polysilicon gate layer 44 are formed for each of the FET devices 35, 36. The gate insulator layer 40 may then be formed by depositing a high-K dielectric material using a thin film deposition process, such as Atomic Layer Deposition (ALD), or Metal-Organic Chemical Vapor Deposition (MOCVD). The metal gate layer 42 may then be deposited over the gate insulator layer 40 using a process such as physical vapor deposition, MOCVD or ALD, and may be followed by deposition of the polysilicon gate layer 44, which may be deposited through Low Pressure Chemical Vapor Deposition (LPCVD) or sputtering. Photolithography and RIE are used to define the gate stack from the gate insulator layer 40, the metal gate layer 42, and the polysilicon gate layer 44.

Dielectric layers 46, 48 and temporary nitride spacers (not shown) are formed adjacent to the layers 40, 42, 44 of the gate stack. Elevated or raised source/drain regions 50 are formed adjacent on the active regions 37, 38 adjacent to the gate stack of each of the devices 35, 36. An epitaxial growth process to selectively deposit a semiconductor, such as silicon, silicon germanium (SiGe), silicon carbide (SiC), or mixtures of silicon, carbon and germanium, to form the raised source/drain regions 50. The temporary nitride spacers space the respective gate stacks from the raised source/drain regions 50. Additional oxide cap and nitride cap layers (not shown) may also be formed on top of the polysilicon gate layer 44 to prevent deposition of epitaxial silicon on the gate stack when the raised source/drain regions 50 are formed. A thin oxide layer (not shown) may be formed on the raised source drain regions 50.

The raised source/drain regions 50 for n-channel FET devices 35, 36 may be doped with a dopant such as P, As, Sb, or other suitable n-type dopant, while raised source/drain regions 50 for p-channel FET devices 35, 36 may be implanted with a dopant such as B, Al, Ga, or any other suitable p-type dopant. The dopants may be introduced by ion implantation using the temporary nitride spacers as a self-aligning mask and separate resist masks during n-type and p-type dopant implantations. The FET devices 35, 36 may be of the same type or of different types.

The temporary nitride spacers are removed by a selective etch, such as a hot phosphoric acid etch, with the dielectric layer 48 and the thin oxide layer acting as etch stops. Permanent nitride spacers 52 are formed by depositing a nitride layer on the SOI wafer 10, applying a patterned resist layer as an etch mask, followed by etching using RIE, with the thin raised source/drain oxide layers again acting as a vertical etch stop.

Silicide areas 45, 54 may then be formed to provide contacts and lower the sheet resistance of the raised source/drain regions 50 and the polysilicon gate layer 44. The silicide areas 45, 54 may be formed by removing the thin raised source/drain oxide and gate oxide cap, depositing Titanium (Ti), Cobalt, (Co), Nickel (Ni), Tungsten (W), Platinum (Pt), or any other suitable metal for forming a silicide, followed by annealing and etching steps, to form silicide areas 45, 54 on the raised source/drain regions 50 and polysilicon gate layer 44.

Device 70 is formed using the semiconductor material in active region 41 of the SOI layer 16 at a location above the doped region 22. The device 70 may consist of a metal-oxide-semiconductor field effect transistors (MOSFET) having heavily doped source/drain diffusions or regions 66, 68, a gate dielectric 60, and a gate electrode 62. Contingent upon the specific device type, source/drain region 66 may act as a drain and source/drain region 68 may act as a source, or the converse associations may apply. The gate electrode 62 is located above a planar channel, which is generally defined in the SOI layer 16 between the doped semiconductor material of the source/drain regions 66, 68. The thin gate dielectric layer 60 electrically insulates the gate electrode 62 from the channel, which is lightly doped to have a conductivity type opposite to the conductivity type of the semiconductor material contained in the source/drain regions 66, 68.

Candidate dielectric materials for the gate dielectric layer 60 include, but are not limited to, silicon oxynitride ($SiO_xN_y$), silicon nitride ($Si_3N_4$), silicon dioxide ($SiO_2$), a hafnium-based dielectric material like hafnium oxide ($HfO_2$) or hafnium oxynitride (HfSiON), and layered stacks of these and other dielectric materials. The material used to form the gate electrode 62 may be, for example, polysilicon, a metal like tungsten or a tungsten alloy, or any other suitable conductor. The source/drain regions 66, 68 and their extensions and halos may be formed by diffusion and/or ion implantation of suitable dopant species. The source/drain regions 66, 68 and their extensions and halos may be doped to form either an n-channel MOSFET or a p-channel MOSFET. Sidewall spacers 64 of a material such as $Si_3N_4$ are applied to the vertical sidewalls of the gate electrode 62 by a spacer formation technique familiar to a person having ordinary skill in the art. The elements of the device 70 are fabricated by conventional processes familiar to a person having ordinary skill in the art of device manufacturing.

In an alternative embodiment, FET device 70 may have a construction identical to the FET devices 35, 36.

In operation, doped region 22 may form an n-type back gate for FET device 35, which may lower the conduction band in the channel of device 35 relative to its Fermi level and thereby decrease the threshold voltage, $V_T$, of device 35. Likewise, doped region 30 may form a p-type back gate for FET device 36, raising the conduction band in the channel of device 36 relative to its Fermi level and thereby increasing the $V_T$ of device 36. Thus, in embodiments of the invention, the $V_T$ of each of the overlying FET devices 35, 36 may be adjusted independently of its channel doping by altering the doping level of its respective back gate. In one embodiment, the FET devices 35, 36 may be of the same type (i.e., source/drain doping) and be characterized by different threshold voltages due to the electrically-coupled doped regions 22, 30. A back-gate voltage ($V_{BG}$) applied to the electrically-coupled doped regions 22, 30 can be used to modulate the threshold voltages of both FET devices 35, 36. The modulation to provide different threshold voltages can be achieved without changing the front gate structures to have different work functions.

For device pairs having oppositely doped regions 22, 30 forming back gates, it may be desirable for the back gates of both devices 35, 36 to be tightly coupled so that they are at the same back-gate voltage. The doped region 30, which has the same doping type as the substrate 12, is electrically connected to the substrate 12. The back-gate potential of the doped region 30 may therefore be adjusted by controlling the voltage on the substrate 12. The overlapping region 32 in conjunction with the damage region 34 defines a pseudo butted junction that enables a leakage current, under given back-gate bias, to flow between the doped regions 22, 30 so that the junction therebetween is leaky.

However, a back gate of opposite doping type (e.g., doped region 24) from the substrate 12 may form depletion regions at the boundary between the back gate and the substrate 12, preventing free carrier movement across the boundary. As a result, the doped region 24 is electrically isolated from the $V_{BG}$ applied to the electrically-coupled doped regions 22, 30. As a result, the threshold voltage for the FET device 70 can be independently adjusted by applying a different back-gate voltage ($V_{BG}$) to the doped region 24.

By partially overlapping the back gates defined by doped regions 22, 30 in the overlapping region 32 and forming the damage region 34 in the overlapping region 32, doped region 22 may be coupled to the substrate 12 without formation of contacts below the buried dielectric layer 14 and extending through the dielectric layer 14 from above. The defects in the damage region 34 may reduce the carrier lifetime in the overlapping region 32 between the doped region 22 forming the back gate for device 35 and the doped region 30 forming the back gate for device 36. The resulting increased carrier recombination in the overlapping region 32 may allow conduction between doped regions 22, 30 by forming a leaky junction. The defects in the damage region 34 may also increase carrier recombination in doped region 30. However, because the doped region 30 and substrate 12 have a common conductivity type, the increased recombination rate in doped region 30 may be inconsequential because region 30 may be inherently conductive with the substrate 12. Doped region 22 may thus be coupled to substrate 12 through a conduction path that includes the overlapping region 32 and doped region 30.

Doped region 24 is not impacted by the overlapping implants or the damage region 34. As a result, doped region 24 may form a non-leaky back gate that is electrically floating and a p-n junction with the bulk substrate 12 of opposite conductivity type. Therefore, the doped region 24 may be used for other purposes, such as to form an p-n junction diode, or as a back gate to adjust the threshold voltage, $V_T$, of thick oxide devices by forming a contact (not shown) with doped region 24 and applying a back gate bias voltage independent of the substrate voltage.

By allowing doped regions 22, 30 of adjacent complementary devices to overlap, and introducing defects in damage region 34 into the back gate having the same doping type as the substrate 12, oppositely doped regions 22, 30 may be selectively conductively coupled to the substrate 12 by adjusting the back gate ion implantation mask pattern. Doped region 22 is made non-floating without the need for metalized contacts or interconnects below the buried dielectric layer 14. This may allow more flexible device positioning and higher integration densities because devices having alternately doped back gates may no longer require substrate contact structures to prevent floating. Design rules requiring devices having back gates that are alternately doped from the substrate 12 be aligned in a row so that the back gates can share a single contact may no longer be necessary, allowing complementary devices to be placed randomly as required. This feature may allow devices having high $V_T$ to be fabricated directly adjacent to devices having low $V_T$ without regard to horizontal orientation, giving integrated circuit designers more flexibility than processes requiring like devices to be immediately adjacent to each other in a row. Accordingly, the defects in the damage region 34 and the presence of the overlapping region 32 may simplify device fabrication, and may allow more flexible device placement between complementary devices, which may increase integration densities and circuit performance.

Figure 6:
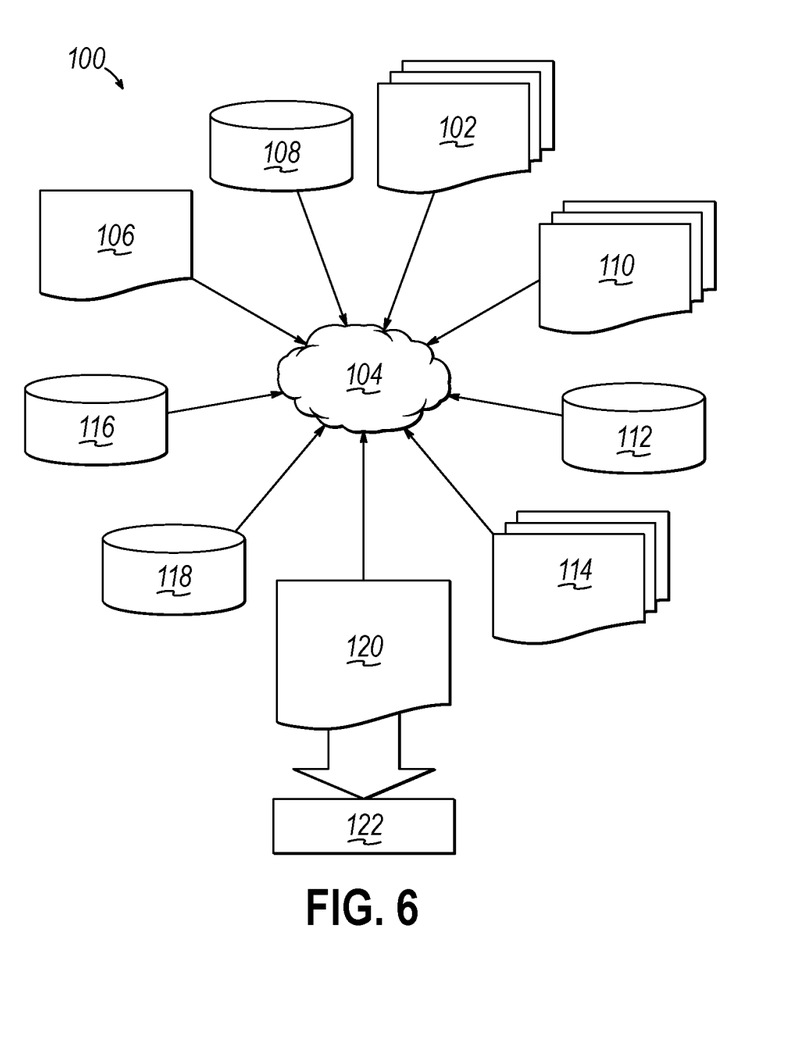
FIG. 6 is a flow diagram of a design process used in semiconductor design, manufacture, and/or test.

FIG. 6 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 5. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 5. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIG. 5 to generate a Netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including Netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 5. In one embodiment, design structure 120 may comprise a compiled, executable HDL simulation model that functionally simulates the devices shown in FIG. 5.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 5. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A device structure formed on a semiconductor-on-insulator (SOI) substrate having a semiconductor layer, a bulk substrate of a first conductivity type, and buried dielectric layer between the semiconductor layer and the bulk substrate, the device structure comprising:
    a first back gate of the first conductivity type in the bulk substrate, the first back gate electrically coupled with the bulk substrate of the first conductivity type;
    a second back gate of a second conductivity type in the bulk substrate, the second back gate laterally adjacent to the first back gate;
    an overlapping region defined by spatial coincidence of a portion of the first back gate and a portion of the second back gate, the overlapping region configured to electrically couple the second back gate with the first back gate so that the second back gate is electrically coupled with the bulk substrate; and
    a damage region extending laterally across the overlapping region from the first back gate to the second back gate, the damage region cooperating with the overlapping region to provide a leakage current electrically coupling the second back gate with the first back gate.

2. The device structure of claim 1 wherein the damage region includes defects in a crystalline lattice structure of the bulk substrate that that supply midgap energy levels in a bandgap of the semiconductor material of the bulk substrate.

3. The device structure of claim 1 wherein the damage region includes a concentration of a dopant that supplies midgap energy levels in a bandgap of the semiconductor material of the bulk substrate.

4. The device structure of claim 1 further comprising:
    a third back gate of the second conductivity type in the substrate, the third back gate electrically isolated from the first back gate, the second back gate, and the substrate.

5. The device structure of claim 1 further comprising:
a first transistor including a gate stack over the first back gate and separated from the first back gate by the buried dielectric layer; and
a second transistor including a gate stack over the second back gate and separated from the second back gate by the buried dielectric layer.

6. The device structure of claim 5 wherein the first and second transistors have different threshold voltages, and the first and second back gates are configured to receive a first back-gate voltage to modulate the respective threshold voltages of the first and second transistors.

7. The device structure of claim 1 wherein the semiconductor layer has a thickness of 30 nm or less, and the buried dielectric layer has a thickness of 20 nm or less.

8. The device structure of claim 7 further comprising:
a third back gate of the second conductivity type formed in the substrate, the third back gate electrically isolated from the first back gate, the second back gate, and the substrate; and
a third transistor including a gate stack over the third back gate and separated from the third back gate by the buried dielectric layer,
wherein the third back gate is configured to receive a second back-gate voltage to modulate a threshold voltage of the third transistor.

* * * * *